US010217621B2

(12) United States Patent
Ruach-Nir et al.

(10) Patent No.: US 10,217,621 B2
(45) Date of Patent: Feb. 26, 2019

(54) CLEANLINESS MONITOR AND A METHOD FOR MONITORING A CLEANLINESS OF A VACUUM CHAMBER

(71) Applicant: APPLIED MATERIALS ISRAEL LTD., Rehovot (IL)

(72) Inventors: Irit Ruach-Nir, Rehovot (IL); Michal Eilon, Beit-Elazari (IL); Guy Eytan, Kidron (IL); Magen Yaacov Schulman, Herzliya (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 0 days.

(21) Appl. No.: 15/653,299

(22) Filed: Jul. 18, 2017

(65) Prior Publication Data
US 2019/0027354 A1 Jan. 24, 2019

(51) Int. Cl.
*H01J 49/04* (2006.01)
*H01L 21/67* (2006.01)
*H01J 49/00* (2006.01)

(52) U.S. Cl.
CPC ...... *H01J 49/0468* (2013.01); *H01J 49/0031* (2013.01); *H01L 21/67276* (2013.01)

(58) Field of Classification Search
CPC .... H01J 49/0468; H01J 49/0031; H01J 49/24; H01J 37/16; H01J 37/18; H01J 37/26; H01J 37/3171; H01L 21/67276
See application file for complete search history.

(56) References Cited

U.S. PATENT DOCUMENTS 5,162,652 A * 11/1992 Cohen .................. G01N 1/2214
250/288
5,271,264 A * 12/1993 Chanayem ......... G01N 33/0009
250/492.2
(Continued)

FOREIGN PATENT DOCUMENTS

JP          10111880 A     4/1998
JP       2001091504 A     4/2001
(Continued)

OTHER PUBLICATIONS

PCT/US2018/042154, "International Search Report and Written Opinion", dated Nov. 2, 2018, 11 pages.

*Primary Examiner* — David E Smith
(74) *Attorney, Agent, or Firm* — Kilpatrick Townsend & Stockton LLP

(57) ABSTRACT

A cleanliness monitor for monitoring a cleanliness of a vacuum chamber. The cleanliness monitor may include a mass spectrometer, a molecule aggregation and release unit and an analyzer. The molecule aggregation and release unit is configured to (a) aggregate, during an aggregation period, organic molecules that are present in the vacuum chamber and (b) induce, during a release period, a release of a subset of the organic molecules towards the mass spectrometer. The mass spectrometer is configured to monitor an environment within the vacuum chamber and to generate detection signals indicative of a content of the environment; wherein a first subset of the detection signals is indicative of a presence of the subset of the organic molecules. The analyzer is configured to determine the cleanliness of the vacuum chamber based on the detection signals.

22 Claims, 12 Drawing Sheets

(56) References Cited

U.S. PATENT DOCUMENTS

| | | | |
|---|---|---|---|
| 7,299,711 B1* | 11/2007 | Linker | G01N 1/2214 |
| | | | 73/863.23 |
| 2006/0216839 A1 | 9/2006 | Shemesh et al. | |
| 2013/0199269 A1* | 8/2013 | Soers | G01N 1/405 |
| | | | 73/23.41 |
| 2016/0204012 A1* | 7/2016 | Bores | H01L 21/67366 |
| | | | 206/204 |

FOREIGN PATENT DOCUMENTS

| | | |
|---|---|---|
| JP | 2007064647 A | 3/2007 |
| WO | 2012056376 A1 | 5/2012 |

\* cited by examiner

CLEANLINESS MONITOR AND A METHOD FOR MONITORING A CLEANLINESS OF A VACUUM CHAMBER

BACKGROUND OF THE INVENTION

Molecular contamination is a fundamental issue in semiconductor manufacturing, specifically, in tools that include vacuum chambers, such as scanning electron microscopes. Organic molecules may originate from organics component inside the vacuum chamber, as well as from wafers that were previously inserted into the vacuum chamber. These organic molecules are absorbed on the surface of the inspected wafer, to form islands that cover fractions of the surface. These island may result in wafer malfunctions. The cleanliness level varies with time due to maintenance activities and the outgassing level of the inspected wafers.

There is a growing need to provide a device and method for monitoring the cleanliness of vacuum chambers.

SUMMARY OF THE INVENTION

There may be provided a cleanliness monitor for monitoring a cleanliness of a vacuum chamber, the cleanliness monitor may include a mass spectrometer; a molecule aggregation and release unit that may be configured to (a) aggregate, during an aggregation period, organic molecules that may be present in the vacuum chamber and (b) induce, during a release period, a release of a subset of the organic molecules towards the mass spectrometer; wherein the mass spectrometer may be configured to monitor an environment within the vacuum chamber and to generate detection signals that may be indicative of a content of the environment; wherein a first subset of the detection signals may be indicative of a presence of the subset of the organic molecules; and an analyzer that may be configured to determine the cleanliness of the vacuum chamber based on the detection signals.

The molecule aggregation and release unit may include a heating element that may be thermally coupled to a molecule aggregator of the molecule aggregator and releaser.

The molecule aggregation and release unit may include a molecule releaser that may be electrically coupled to a molecule aggregator of the molecule aggregator and releaser; and wherein the molecule releaser may be configured to drive an electrical current through the molecule aggregator thereby heating the molecule aggregator.

The molecule aggregation and release unit may include a spiral electrical conductor.

The molecule aggregation and release unit may include a spiral electrical insulator.

The molecule aggregation and release unit may include a non-smooth plate.

The cleanliness monitor may include a flow control unit for affecting a propagation of the aggregated molecules during the release period.

The flow control unit may include a pump for directing the aggregated molecules towards the mass spectrometer.

The molecule aggregation and release unit may be configured to apply a given release process for inducing the release of the subset of the organic molecules towards the mass spectrometer; and wherein the cleanliness monitor further may include a dummy molecule aggregation and release unit that has a lower exposure to the organic molecules than the molecule aggregation and release unit and may be configured to apply the given release process.

The cleanliness monitor may include an additional mass spectrometer that may be configured to monitor a space within the vacuum chamber that includes the dummy molecule aggregator and releaser.

A second subset of the detection signals may be not indicative of a presence of some of the organic molecules. The analyzer may be configured to determine the cleanliness of the vacuum chamber based on a comparison between the first and second subsets of the detection signals.

The second subset of the detection signals may be obtained before the release period of after a predefined period after the release period.

The aggregation period may be longer than the release period.

There may be provided a method for monitoring a cleanliness of a vacuum chamber, the method may include aggregating organic molecules that may be present in the vacuum chamber, during an aggregation period and by a molecule aggregation and release unit that may be positioned within the vacuum chamber; inducing during a release period, by the molecule aggregator and releaser, a release of a subset of the organic molecules towards a mass spectrometer; monitoring by the mass spectrometer an environment within the vacuum chamber and generating, by the mass spectrometer, detection signals indicative of a content of the environment; wherein a first subset of the detection signals may be indicative of a presence of the subset of the organic molecules; and determining, by an analyzer and based on the detection signals, the cleanliness of the vacuum chamber.

The molecule aggregation and release unit may include a heating element that may be thermally coupled to a molecule aggregator of the molecule aggregator and releaser.

The molecule aggregation and release unit may include a molecule releaser that may be electrically coupled to a molecule aggregator of the molecule aggregator and releaser; and wherein the method may include driving, by the molecule releaser, an electrical current through the molecule aggregator thereby heating the molecule aggregator.

The molecule aggregation and release unit may include a spiral electrical conductor.

The molecule aggregation and release unit may include a spiral electrical insulator.

The molecule aggregation and release unit may include a non-smooth plate. The cleanliness monitor may include a flow control unit and the method may include affecting, by the flow control unit, a propagation of the aggregated molecules during the release period.

The flow control unit may include a pump and the method may include directing, by the pump, the aggregated molecules towards the mass spectrometer.

The method may include applying, by the molecule aggregation and release unit, a given release process for inducing the release of the subset of the organic molecules towards the mass spectrometer; and applying, by a dummy molecule aggregation and release unit that has a lower exposure to the organic molecules than the molecule aggregation and release unit, the given release process.

The cleanliness monitor may include an additional mass spectrometer and the method may include monitoring, by the additional mass spectrometer, a space within the vacuum chamber that includes the dummy molecule aggregator and releaser.

A second subset of the detection signals may be not indicative of a presence of some of the organic molecules. The method may include determining, by the analyzer, the cleanliness of the vacuum chamber based on a comparison between the first and second subsets of the detection signals.

The second subset of the detection signals may be obtained before the release period of after a predefined period after the release period.

The aggregation period may be longer than the release period.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION OF EMBODIMENTS

Figure 1:
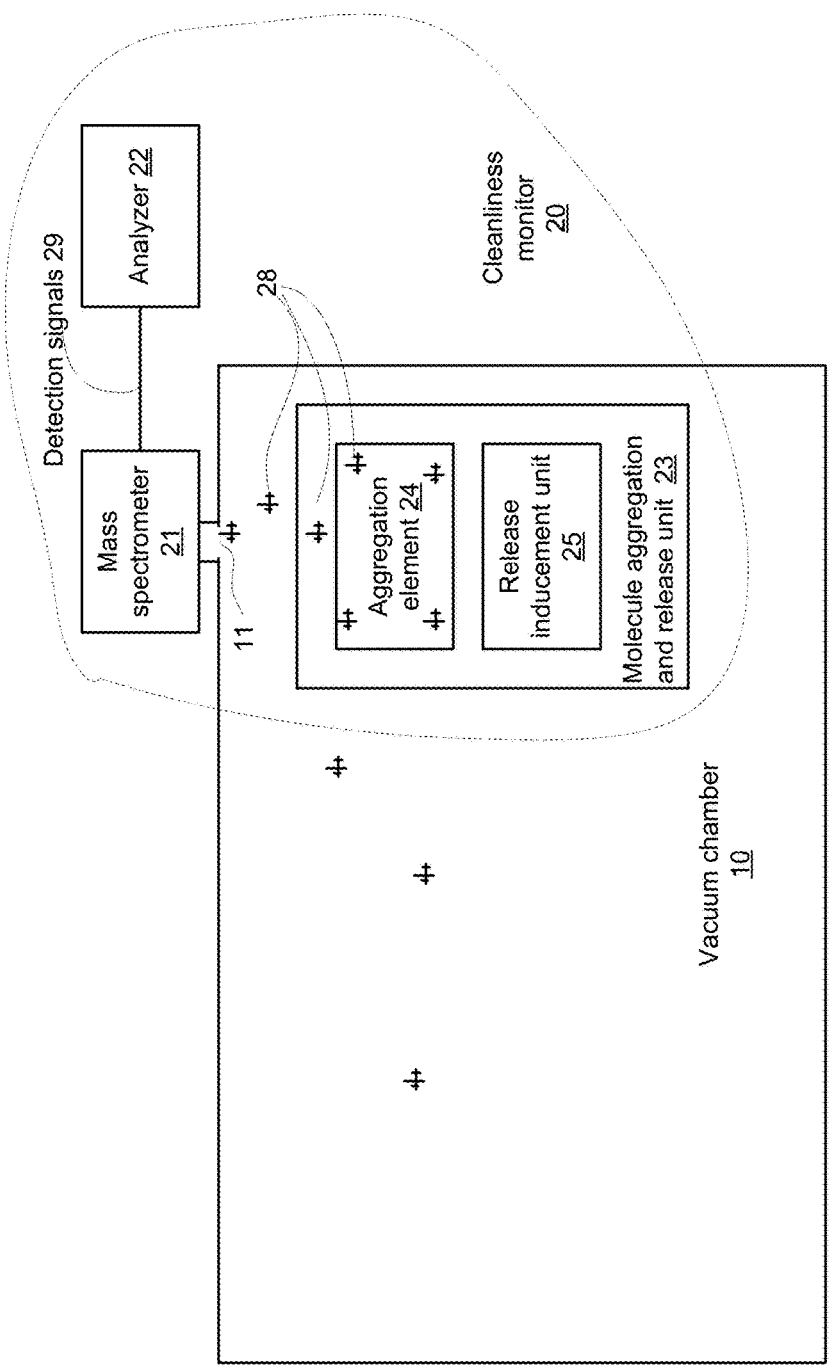
FIG. 1 is an example of a vacuum chamber and a cleanliness monitor.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method. Any reference in the specification to a system should be applied mutatis mutandis to a method that may be executed by the system. Any reference to the term "comprising" or "having" should be interpreted also as referring to "consisting" of "essentially consisting of". For example, a method that comprises certain steps can include additional steps, can be limited to the certain steps or may include additional steps that do not materially affect the basic and novel characteristics of the method, respectively.

There may be provided a cleanliness monitor for monitoring a cleanliness of a vacuum chamber. The cleanliness of the vacuum chamber of a function of a concentration of organic molecules within the vacuum chamber.

FIG. 1 illustrates vacuum chamber 10, and a cleanliness monitor 20 according to an embodiment of the invention. Cleanliness monitor 20 includes mass spectrometer 21, analyzer 22 and a molecule aggregation and release unit 23. Molecule aggregation and release unit 23 may be positioned within vacuum chamber 10. Mass spectrometer 21 and analyzer 22 may be positioned outside the vacuum chamber 10.

Vacuum chamber 10 may include an aperture 11 to enable the mass spectrometer 21 to be exposed to the environment within the vacuum chamber. The molecule aggregation and release unit 23 is configured to (a) aggregate, during an aggregation period, organic molecules that are present in the vacuum chamber 10 and (b) to induce a release of a subset of the organic molecules towards the mass spectrometer during a release period.

The aggregation of the organic molecules is achieved by the positioning of the molecule aggregation and release unit 23 within the vacuum chamber 10. Even when the molecule aggregation and release unit 23 is not able to control the propagation path of the released organic molecules—some of the released organic molecules will reach the mass spectrometer 21—especially when the aggregation element 24 is close enough to the mass spectrometer. The distance that may be deemed to be close enough may range, for example, between 1 centimeter and 50 centimeters. The distance that is deemed to be close enough may exceed 50 centimeters. The distance that is deemed to be close enough may depend on the sensitivity of the mass spectrometer 21.

The molecule aggregation and release unit 23 may include an aggregation element 24 and a release inducement unit 25. The aggregation element 24 aggregates the organic molecules and the release inducement unit 25 may induce the organic molecules to detach from the aggregation element. The aggregation element 24 may be spaced apart from the release inducement unit 25, may be connected to the release inducement unit 25, may be thermally coupled to the release inducement unit 25, may be thermally isolated from the release inducement unit 25, may be electrically coupled to the release inducement unit 25 and/or may be electrically isolated from the release inducement unit 25.

The release inducement unit 25 may induce the release of the organic molecules by heating the aggregation element 24 and/or by directing radiation onto the aggregation element 24. The release inducement unit 25 may scan the aggregation element 24 with a laser beam that will induce the organic molecules to be released from the aggregation element 24. The release inducement unit 25 may be a heating element that will send heat rays (or any kind of heat radiation) towards the aggregation element 24. The release inducement unit 25 may send an electrical signal through the aggregation element 24 thereby causing Joule heating (also referred to as Ohmic heating or resistive heating) of the aggregation element 24.

The aggregation element 24 may have any shape and size. For example—the aggregation element 24 may be a plate, may include one or more plates, may be curved, and the like. The aggregation element 24 may have a large surface area in order to increase the chances of organic molecule aggregation while reducing the overall volume of the aggregation element 24. Non-limiting examples of an aggregation element 24 that may have a large surface area may include a spiral, multiple loops, a two or three-dimensional mesh, and the like.

The aggregation element 24 may aggregate the organic molecule during an aggregation period that may be relatively long. For example—the aggregation period may last one or more hours, five or more hours, ten or more hours, one or more days, and the like. The aggregation period may be much longer than the release period. For example—the aggregation period may be N times longer that the release period. N being a positive number that may range between 2 and 500—or may have any value.

Higher N values (higher aggregation period to release period ratios) will result in higher temporal increments in the concentration of the organic molecules—as organic molecules that are aggregated during the (longer) aggregation period are released from the aggregation element 24 at a much shorter period of time. This temporal increment in the concentration of the organic molecules may ease the detection of the organic molecules- and may virtually increase the sensitivity of the mass spectrometer to the organic molecule by a factor of N—or by a factor that may depend on the value of N.

By allowing the organic molecule to aggregate on the aggregation element 24 for relatively long aggregation period there is a better chance to aggregate a significant amount of the organic molecules.

The duration of the aggregation period may be determined based on measured and/or estimated and/or measured attachment period of the organic molecule. For example, the duration of the aggregation period may be set based on the average attachment period of an organic molecule.

The mass spectrometer 21 may be a residual gas analyzer (RGA) or any other mass spectrometer. The mass spectrometer 21 is configured to monitor an environment within the vacuum chamber 10 and to generate detection signals 29 indicative of a content of the environment. The mass spectrometer 21 may sample the content of the environment that passes through aperture 11. The aperture 11 may be shielded by a shield (not shown) during one or more points in time.

During the release period the mass spectrometer 21 is expected to sense some of the organic molecules 28 that are released from molecule aggregation and release unit 23.

During the mass spectroscopy process the organic molecules are usually broken down to molecules with lower atomic numbers—so that not all the organic molecules can be directly detected by their atomic weight. By comparing between the mass spectrums obtained during the release period or at periods of time that differ from the release period—the analyzer 22 may detect the presence of the organic molecules—and thus determine the cleanliness of the vacuum chamber 10. For example—assuming that an organic molecule having an atomic weight of 200 breaks to molecules with an atomic weight of 57—then the spectrum obtained during the release period may include an increment (in relation to a spectrum obtained outside the release period) in the number of detected molecules having an atomic weight of 57.

Because the mass spectrometer is exposed to and senses a variably of molecules—including the organic molecules released from the molecule aggregation and release unit 23—the comparison may reveal that change in the spectrum resulting from the release period.

Figure 2:
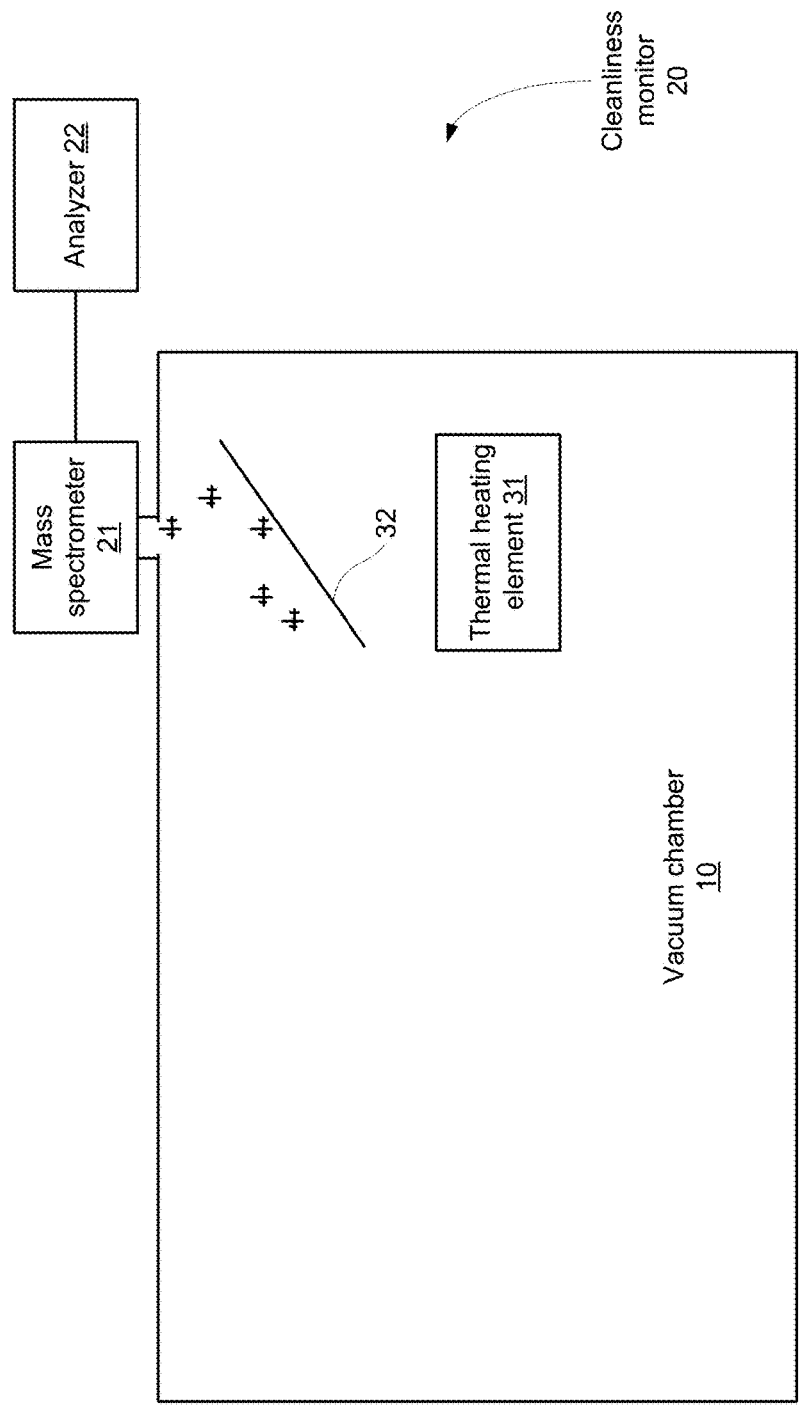
FIG. 2 is an example of a vacuum chamber and a cleanliness monitor.

FIG. 2 illustrates a vacuum chamber 10, and a cleanliness monitor 20 according to an embodiment of the invention. In FIG. 2 the molecule aggregation and release unit includes a thermal heating element 31 that is spaced apart from a plate 32 that serves as an aggregation element. Plate 32 is oriented by forty-five degrees from the horizon—but may be oriented in any other angle.

Figure 3:
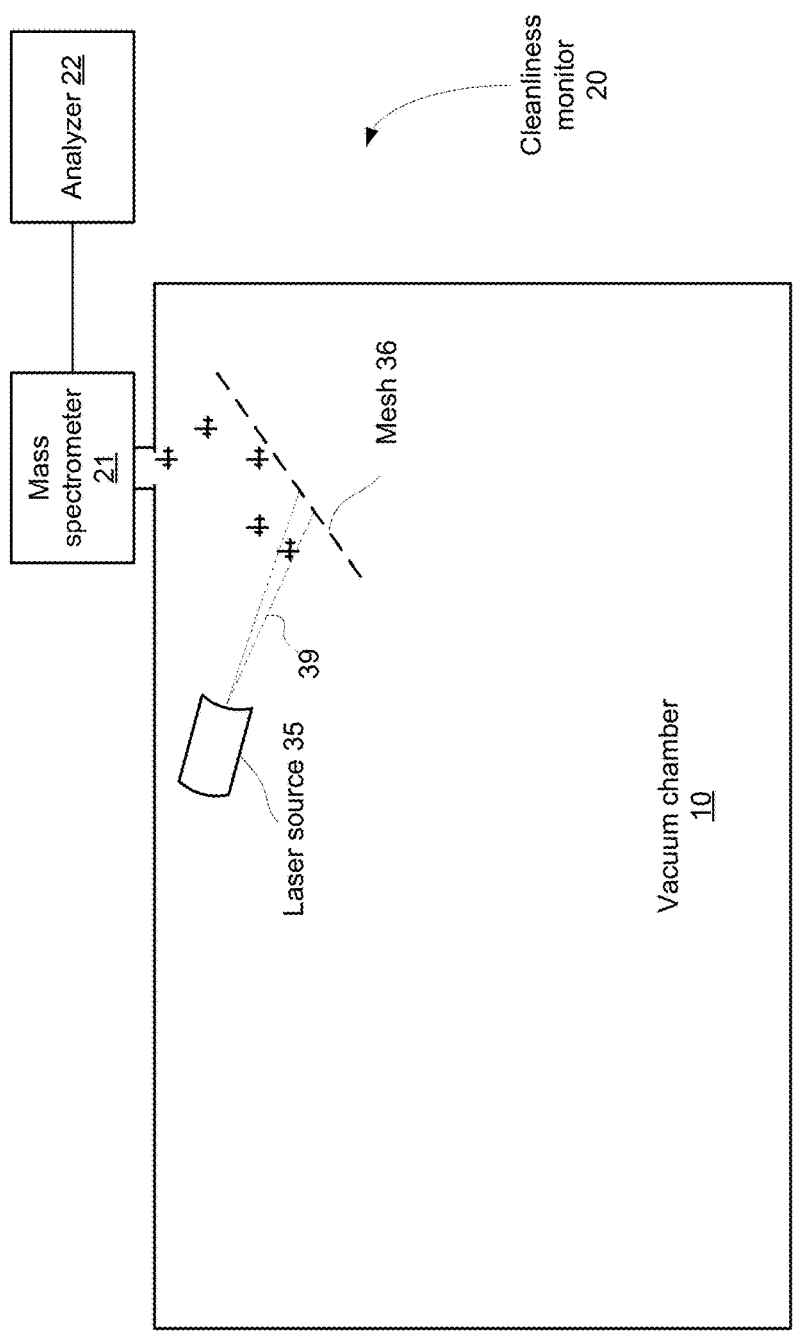
FIG. 3 is an example of a vacuum chamber and a cleanliness monitor.

FIG. 3 illustrates a vacuum chamber 10, and a cleanliness monitor 20 according to an embodiment of the invention. In FIG. 3 the molecule aggregation and release unit includes a radiation source such as laser source 35 that is spaced apart from a mesh 36 that serves as an aggregation element. Laser source 35 scans the mesh 36 during the release period by one or more laser beams such as beam 39.

Figure 4:
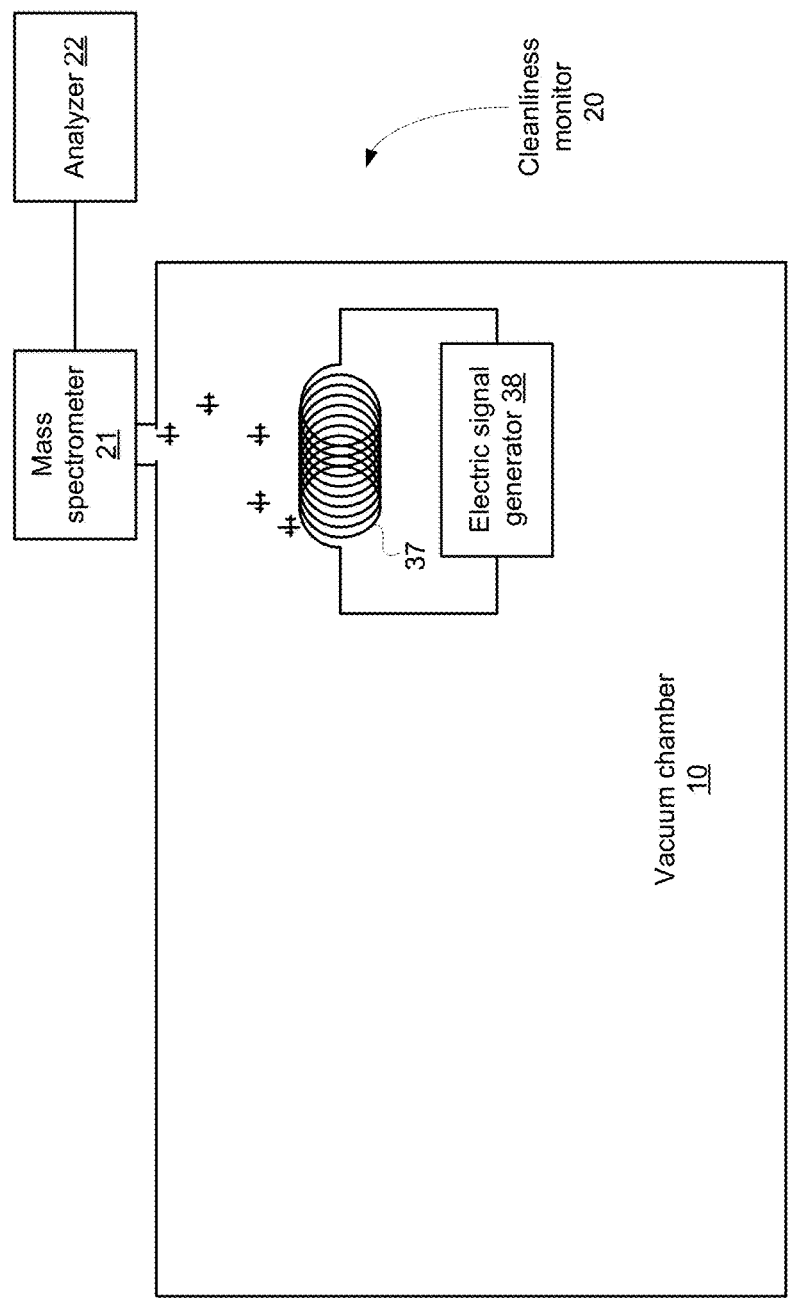
FIG. 4 is an example of a vacuum chamber and a cleanliness monitor.

FIG. 4 illustrates a vacuum chamber 10, and a cleanliness monitor 20 according to an embodiment of the invention. In FIG. 4 the molecule aggregation and release unit is a spiral conductor 37 that is coupled to an electric signal generator 38 that is configured to provide an electric signal to the spiral conductor thereby heating the spiral conductor and releasing organic molecules from the spiral conductor 37. The electric signal generator may be positioned within the vacuum chamber 10 (as illustrated in FIG. 4) or located outside vacuum chamber 10.

Figure 5:
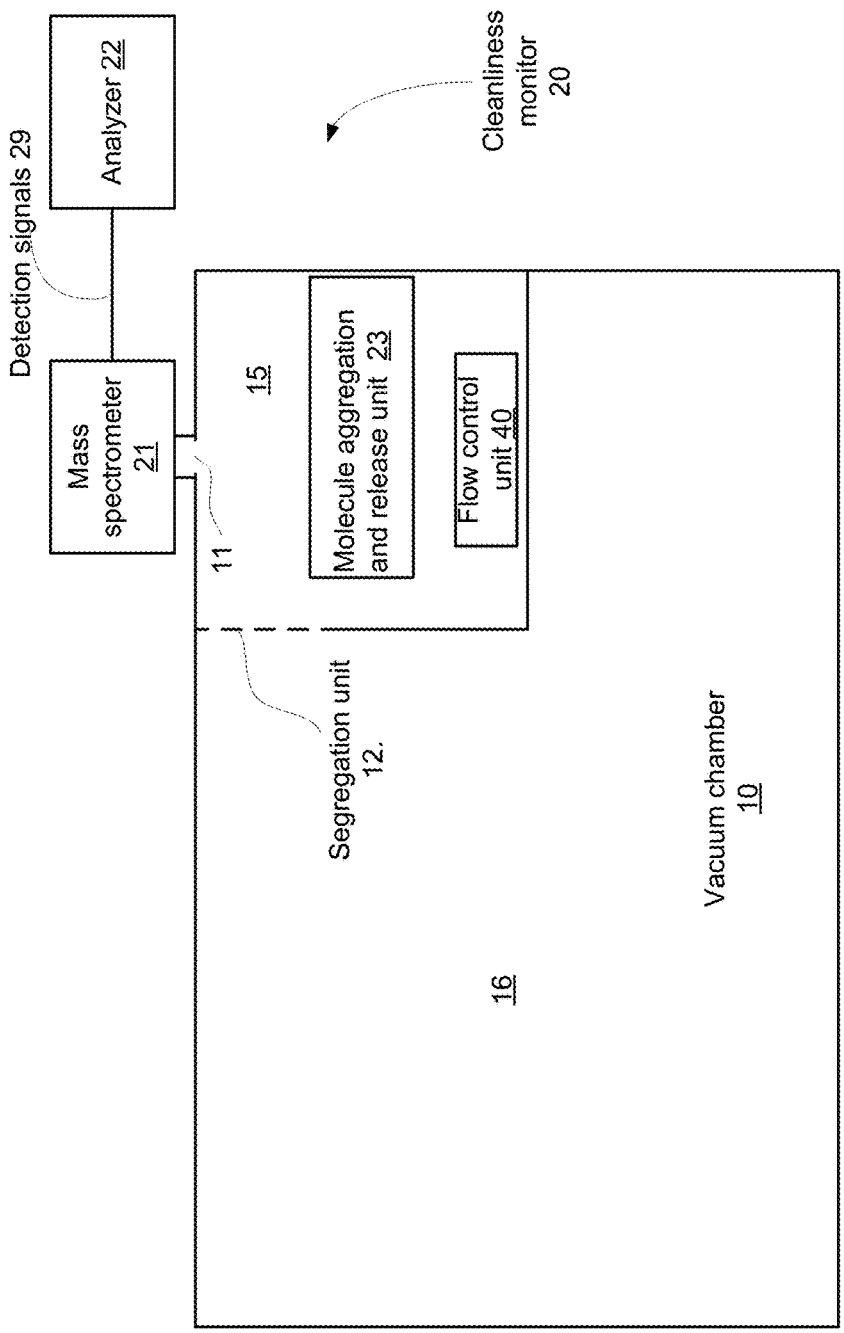
FIG. 5 is an example of a vacuum chamber and a cleanliness monitor.

FIG. 5 illustrates a vacuum chamber 10, and a cleanliness monitor 20 according to an embodiment of the invention. Cleanliness monitor 20 may include a flow control unit 40 for affecting a propagation of the aggregated molecules during the release period. Especially—the flow control unit 40 may induce the released organic molecules to flow towards aperture 11—thereby increase the amount of organic molecule that can be detected by the mass spectrometer 21.

The flow control unit 40 may include a pump that may pump the organic molecules towards the mass spectrometer 21. The pumping operation of the pump may reduce the cleanliness within the second space 16 or may be problematic from any other aspect. In order to overcome this problem—the vacuum chamber 10 may be equipped with a segregating unit 12 for temporarily segregating the molecule aggregation and release unit 23 from other parts of the vacuum chamber.

The segregating unit 12 may be a movable and/or motorized seal, shutter, door or any other component capable of temporarily sealing a first space 15 in which the molecule aggregation and release unit 23 (or at least the Aggregation element) is positioned from a second space 16 within the vacuum chamber 10. A wafer or another inspected object may reside within the second space 16. The segregation may be applied during the release period.

Figure 6:
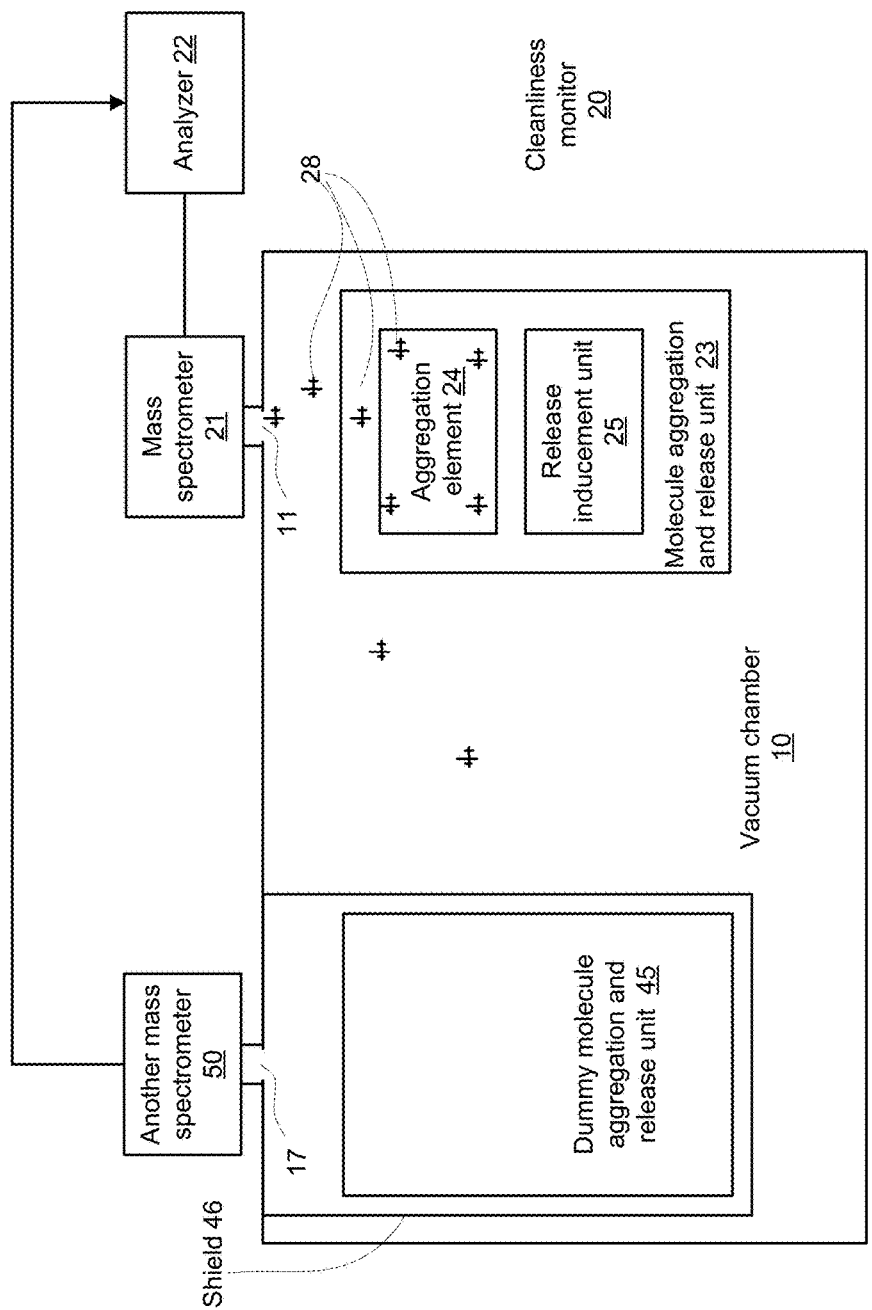
FIG. 6 is an example of a vacuum chamber and a cleanliness monitor.

FIG. 6 illustrates a vacuum chamber 10, and a cleanliness monitor 20 according to an embodiment of the invention. Changes in the content of the environment sensed by the mass spectrometry may be detected and/or enhanced by using a dummy molecule aggregation and release unit 45 that is less exposed (or even not exposed at all) to the organic molecules—in relation to the molecule aggregation and release unit 23. In FIG. 6 the dummy molecule aggregation and release unit 45 is surrounded by a protective shield 46 that prevents the organic molecules from contacting the dummy molecule aggregation and release unit 45. The protective shield may surround a dummy aggregation element of the dummy molecule aggregation and release unit 45 and not the entire dummy molecule aggregation and release unit 45.

The dummy molecule aggregation and release unit 45 and the molecule aggregation and release unit 23 may apply the same release process (heating, radiation)—but the readings of the mass spectrometers may differ from each other—as a result of the lower exposure of the dummy molecule aggregation and release unit 45 to the organic molecules.

FIG. 6 illustrates that the environment of the dummy molecule aggregation and release unit 45 is monitored by another mass spectrometer 50 that may sense the environment of the dummy molecule aggregation and release unit 45 though aperture 17 of vacuum chamber 10. The other mass spectrometer 50 may send dummy detection signals to the analyzer 22 or to another analyzer.

Figure 7:
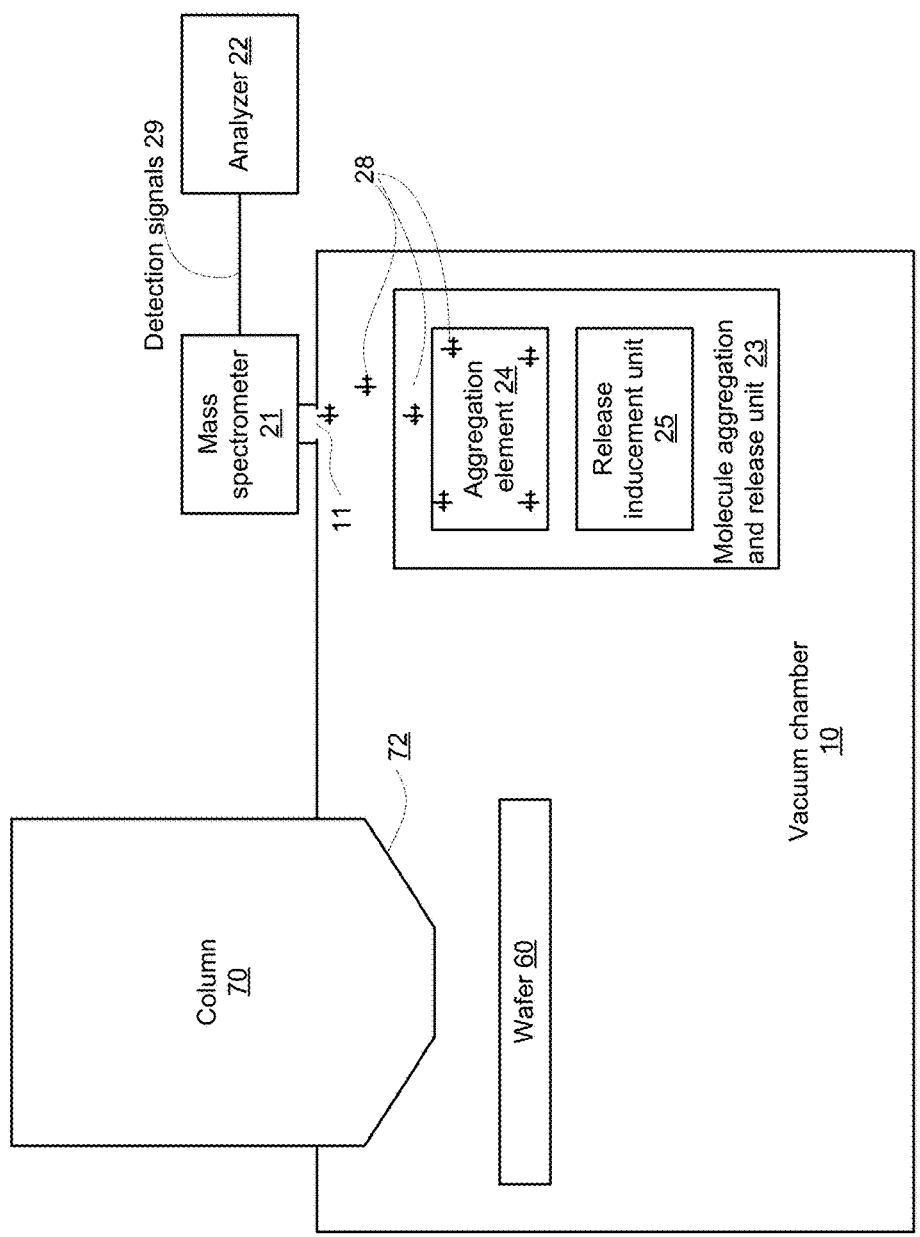
FIG. 7 is an example of a vacuum chamber, a wafer 60, a molecule aggregation and release unit, and a portion of a column of a scanning electron microscope that enters the vacuum chamber.

FIG. 7 illustrates the vacuum chamber 10, a wafer 60, molecule aggregation and release unit 23, and a portion 72 of a column 70 of a scanning electron microscope that enters the vacuum chamber 10 according to an embodiment of the invention.

Figure 8:
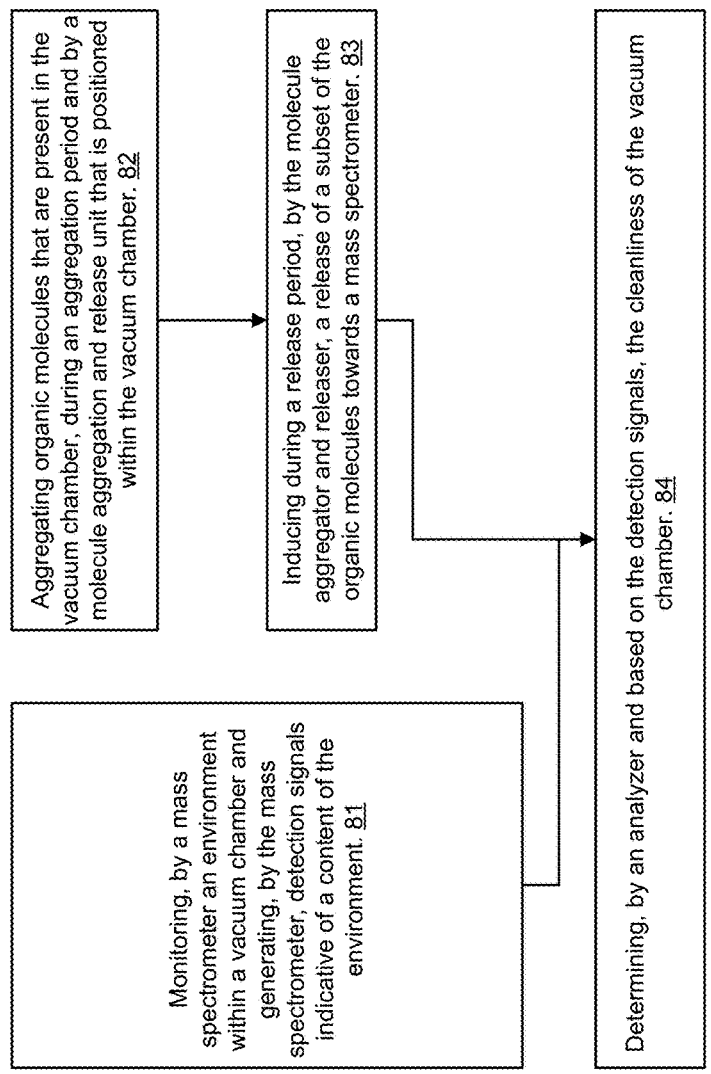
FIG. 8 is an example of a method.

FIG. 8 illustrates a method 80 according to an embodiment of the invention. Method 80 may start by steps 81 and 82. Step 81 may include monitoring, by a mass spectrometer an environment within a vacuum chamber and generating, by the mass spectrometer, detection signals indicative of a content of the environment.

Step 82 may include aggregating organic molecules that are present in the vacuum chamber, during an aggregation period and by a molecule aggregation and release unit that is positioned within the vacuum chamber. Step 82 may be followed by step 83 of inducing during a release period, by the molecule aggregator and releaser, a release of a subset of the organic molecules towards a mass spectrometer. Step 81 may be executed in parallel to the execution of steps 82 and 83, or just in parallel to the execution of step 83.

A first subset of the detection signals (obtained during the release period) is indicative of a presence of the subset of the organic molecules.

Steps 81 and 83 are followed by step 84 of determining, by an analyzer and based on the detection signals, the cleanliness of the vacuum chamber. Step 84 may include comparing detection signals obtained during the aggregation period to detection signals obtained during the release period. The comparison may include comparing spectrum element that represent components of the same atomic weight. The comparison may include comparing only spectrum components that have certain atomic weights—such as atomic weights of the organic molecules or of molecules that are generated as a result of the breaking of the organic molecule during the mass spectroscopy process.

It is noted that method 80 may be repeated multiple times, in a periodic or non-periodic manner.

Figure 9:
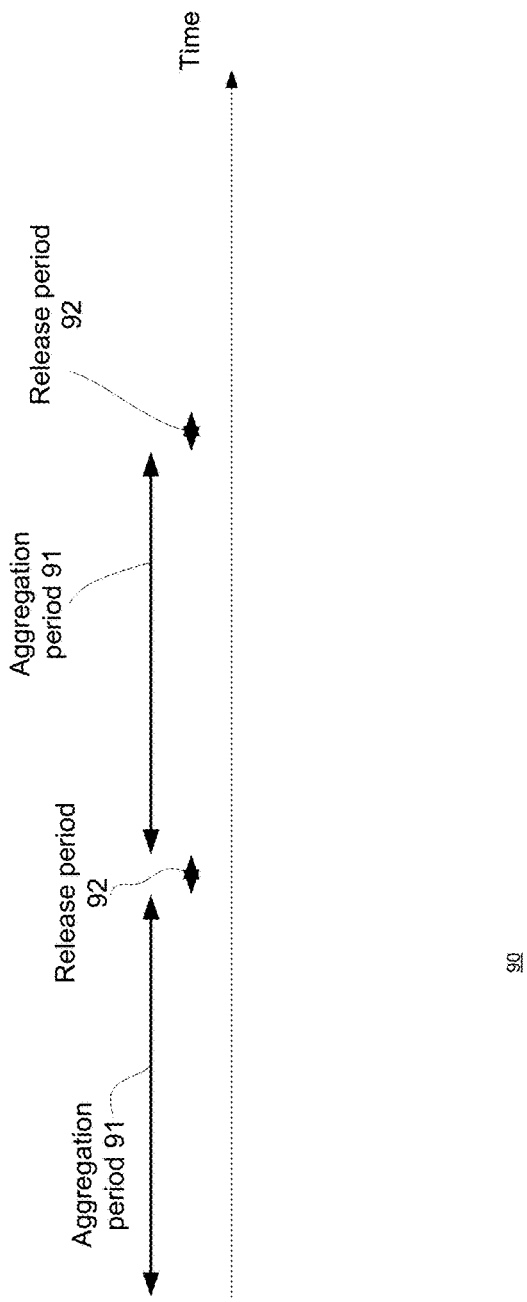
FIG. 9 is a timing diagram that illustrates multiple aggregation periods and multiple release periods according to various embodiments of the invention.

FIG. 9 is a timing diagram 90 that illustrates multiple aggregation periods and multiple release periods according to various embodiments of the invention. Timing diagram 90 illustrates multiple repetitions of aggregation periods 91 and release periods 92.

Figure 10:
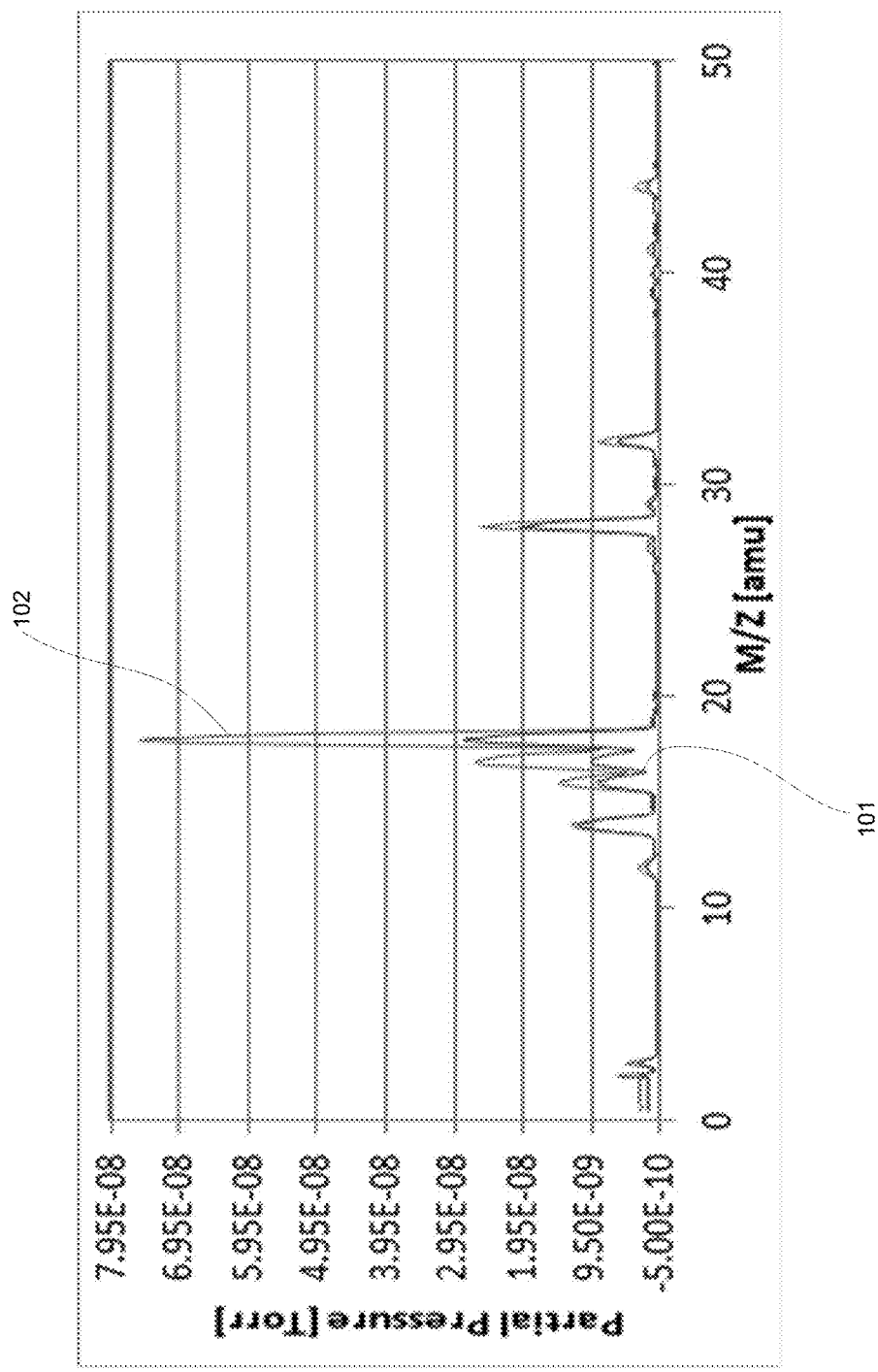
FIG. 10 illustrates an example of the relationship between partial pressure and atomic mass units for light mass.
Figure 11:
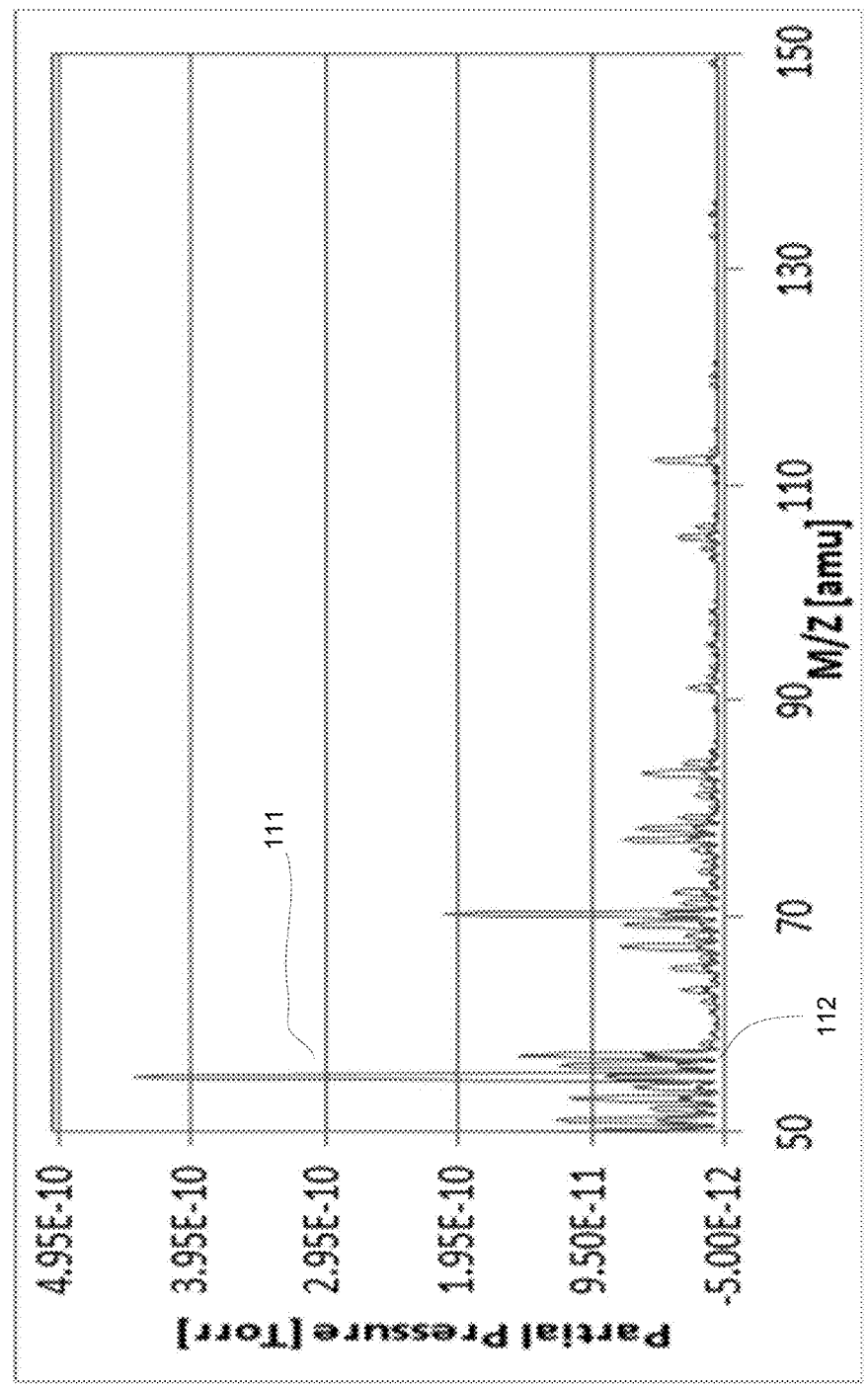
FIG. 11 illustrates an example of the relationship between partial pressure and atomic mass units for medium mass.
Figure 12:
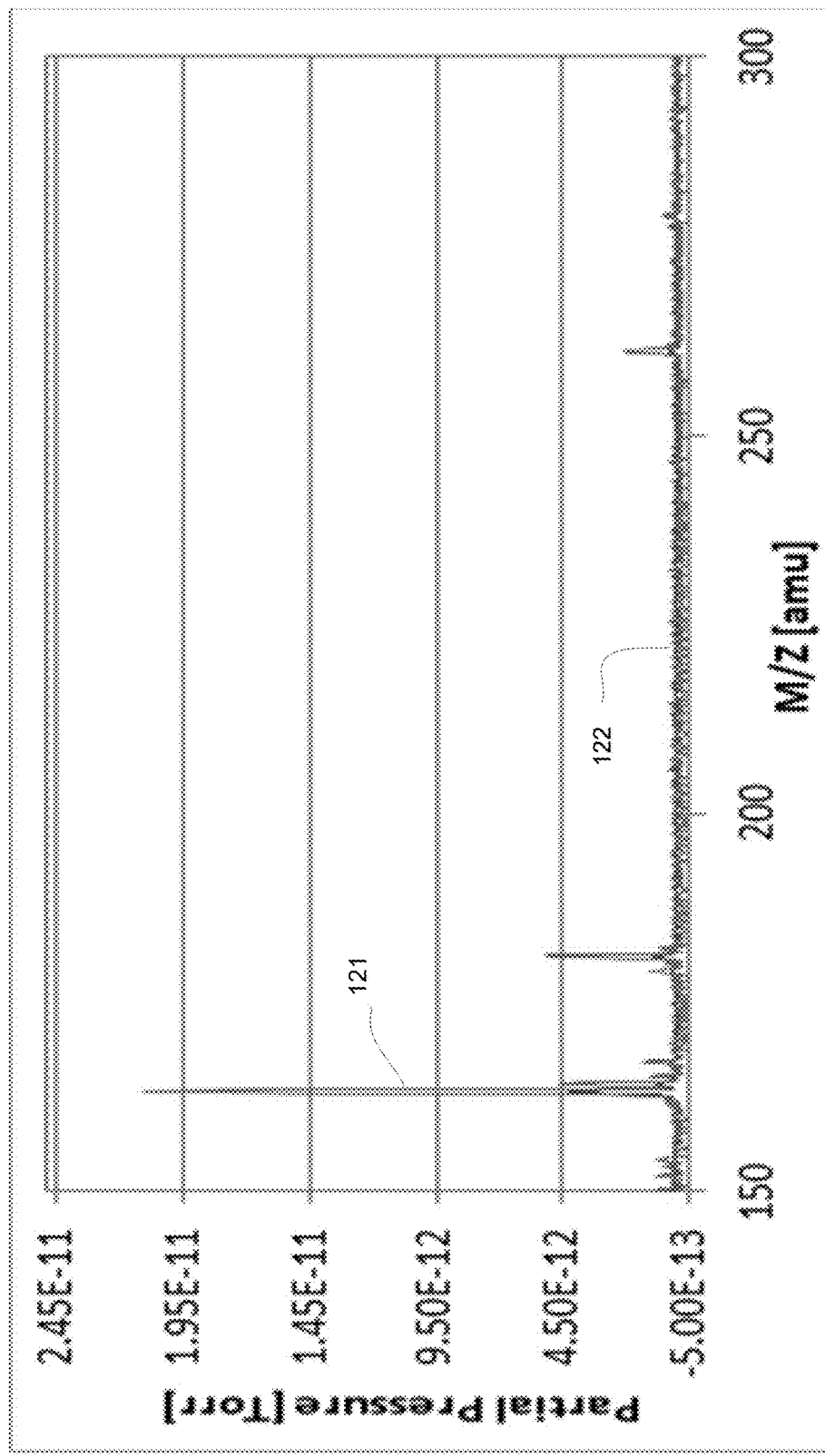
FIG. 12 illustrates an example of the relationship between partial pressure and atomic mass units for high mass.

FIGS. 10, 11 and 12 illustrate the relationship between partial pressure and atomic mass units for light mass (atomic mass unit [AMU] between 0 and 50), medium mass (AMU between 50 and 150 AMU) and high mass (AMU between 150 and 300) respectively. In FIG. 10 curve 102 illustrates the relationship between partial pressure and AMU of the chamber environment during the aggregation period. Curve 101 illustrates the relationship between partial pressure and AMU of the chamber environment during the release period. Curve 101 represents an outgassing. The peaks of curve 101 well exceed the peaks of curve 102.

In FIG. 11 curve 112 illustrates the relationship between partial pressure and AMU of the chamber environment during the aggregation period. Curve 111 illustrates the relationship between partial pressure and AMU of the chamber environment during the release period. Curve 111 represents an outgassing. The peaks of curve 111 well exceed the peaks of curve 112. In FIG. 12 curve 122 illustrates the relationship between partial pressure and AMU of the chamber environment during the aggregation period. Curve 121 illustrates the relationship between partial pressure and AMU of the chamber environment during the release period. Curve 121 represents an outgassing. The peaks of curve 121 well exceed the peaks of curve 122.

In the foregoing specification, the invention has been described with reference to specific examples of embodiments of the invention. It will, however, be evident that various modifications and changes may be made therein without departing from the broader spirit and scope of the invention as set forth in the appended claims. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality. Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments. However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A cleanliness monitor for monitoring a cleanliness of a vacuum chamber, the cleanliness monitor comprising:
   a mass spectrometer with a line of sight to the vacuum chamber;
   a molecule aggregation and release unit that is configured to be positioned within the vacuum chamber and configured to (a) aggregate, during an aggregation period, organic molecules that are present in the vacuum chamber and (b) induce, during a release period, a release of a subset of the organic molecules towards the mass spectrometer;
   wherein the mass spectrometer is configured to monitor an environment within the vacuum chamber and to generate detection signals that are indicative of a content of the environment; wherein a first subset of the detection signals is indicative of a presence of the subset of the organic molecules; and
   an analyzer that is configured to determine the cleanliness of the vacuum chamber based on the detection signals.

2. The cleanliness monitor according to claim 1 wherein the molecule aggregation and release unit comprises a heating element that is thermally coupled to a molecule aggregator of the molecule aggregator and releaser.

3. The cleanliness monitor according to claim 1 wherein the molecule aggregation and release unit comprises a molecule releaser that is electrically coupled to a molecule aggregator of the molecule aggregator and releaser; and wherein the molecule releaser is configured to drive an electrical current through the molecule aggregator thereby heating the molecule aggregator.

4. The cleanliness monitor according to claim 1 wherein the molecule aggregation and release unit comprises a spiral electrical conductor.

5. The cleanliness monitor according to claim 1 wherein the molecule aggregation and release unit comprises a spiral electrical insulator.

6. The cleanliness monitor according to claim 1 wherein the molecule aggregation and release unit comprises a non-smooth plate.

7. The cleanliness monitor according to claim 1 comprising a flow control unit for affecting a propagation of the aggregated molecules during the release period.

8. The cleanliness monitor according to claim 7 wherein the flow control unit comprises a pump for directing the aggregated molecules towards the mass spectrometer.

9. The cleanliness monitor according to claim 1 wherein the aggregation period is longer than the release period.

10. A cleanliness monitor for monitoring a cleanliness of a vacuum chamber, the cleanliness monitor comprising:
    a mass spectrometer;
    a molecule aggregation and release unit that is configured to (a) aggregate, during an aggregation period, organic molecules that are present in the vacuum chamber and (b) induce, during a release period, a release of a subset of the organic molecules towards the mass spectrometer;
    wherein the mass spectrometer is configured to monitor an environment within the vacuum chamber and to generate detection signals that are indicative of a content of the environment wherein a first subset of the detection signals is indicative of a presence of the subset of the organic molecules; and
    an analyzer that is configured to determine the cleanliness of the vacuum chamber based on the detection signals;
    wherein the molecule aggregation and release unit is configured to apply a given release process for inducing the release of the subset of the organic molecules towards the mass spectrometer; and wherein the cleanliness monitor further comprises a dummy molecule aggregation and release unit that has a lower exposure to the organic molecules than the molecule aggregation and release unit and is configured to apply the given release process.

11. The cleanliness monitor according to claim 10 comprising an additional mass spectrometer that is configured to monitor a space within the vacuum chamber that includes the dummy molecule aggregator and releaser.

12. The cleanliness monitor according to claim 11 wherein a second subset of the detection signals are not indicative of a presence of some of the organic molecules; and wherein analyzer is configured to determine the cleanliness of the vacuum chamber based on a comparison between the first and second subsets of the detection signals.

13. The cleanliness monitor according to claim 11 wherein the second subset of the detection signals are obtained before the release period of after a predefined period after the release period.

14. A method for monitoring a cleanliness of a vacuum chamber, the method comprises:
    aggregating organic molecules that are present in the vacuum chamber, during an aggregation period and by a molecule aggregation and release unit that is positioned in situ within the vacuum chamber;
    inducing during a release period, by the molecule aggregator and releaser, a release of a subset of the organic molecules towards a mass spectrometer with a line of sight to the vacuum chamber;
    monitoring by the mass spectrometer an environment within the vacuum chamber and generating, by the mass spectrometer, detection signals indicative of a content of the environment; wherein a first subset of the detection signals is indicative of a presence of the subset of the organic molecules; and
    determining, by an analyzer and based on the detection signals, the cleanliness of the vacuum chamber.

15. The method set forth in claim 14 further comprising generating dummy detection signals with a dummy aggregation and release unit that has lower exposure to the organic molecules than the molecular aggregation and release unit positioned within the vacuum chamber; and wherein the determining step determines the cleanliness of the vacuum chamber based on the detection signals and the dummy detection signals.

16. A cleanliness monitor for monitoring a cleanliness of a vacuum chamber, the cleanliness monitor comprising:
- a first mass spectrometer configured to monitor an environment within the vacuum chamber and generate first detection signals that are indicative of a content of the environment, wherein a subset of the detection signals is indicative of a presence organic molecules;
- a first molecule aggregation and release unit configured to aggregate organic molecules present in the vacuum chamber during an aggregation period and induce a release of a subset of the organic molecules towards the first mass spectrometer during a release period by applying a first release process;
- a second mass spectrometer configured generate second detection signals, wherein a subset of the second detection signals is indicative of a presence organic molecules;
- a second molecule aggregation and release unit having a lower exposure to the organic molecules present in the vacuum chamber than the first molecule aggregation and release unit and configured to release molecules towards the second mass spectrometer by applying a second release process that is the same as the first release process; and
- an analyzer configured to determine the cleanliness of the vacuum chamber based on the first and second detection signals.

17. The cleanliness monitor according to claim 16 further comprising a protective shield configured to reduce the exposure of the second molecule aggregation and release unit to organic molecules present in the vacuum chamber.

18. The cleanliness monitor according to claim 17 wherein the protective shield surrounds an aggregation element of the second molecule aggregation and release unit.

19. The cleanliness monitor according to claim 16 wherein the second molecule aggregation and release unit has no exposure to organic molecules within the vacuum chamber.

20. The cleanliness monitor according to claim 16 wherein the first mass spectrometer is coupled to the first molecule aggregation and release unit by a first aperture of the vacuum chamber and the second mass spectrometer is coupled to the second molecule aggregation and release unit by a second aperture of the vacuum chamber, different than the first aperture.

21. The cleanliness monitor according to claim 16 wherein the first molecule aggregation and release unit is an in situ unit configured to be positioned within the vacuum chamber.

22. The cleanliness monitor according to claim 16 wherein the first molecule aggregation and release unit comprises a heating element that is thermally coupled to a molecule aggregator of the first molecule aggregator and releaser.

* * * * *